United States Patent [19]

Sugishita et al.

[11] Patent Number: 4,581,279
[45] Date of Patent: Apr. 8, 1986

[54] THICK FILM CIRCUIT BOARD

[75] Inventors: Nobuyuki Sugishita, Yokosuka; Hideo Suzuki; Takahiko Ohkohchi, both of Katsuta, all of Japan

[73] Assignee: Hitachi, Ltd., Tokyo, Japan

[21] Appl. No.: 566,913

[22] Filed: Dec. 29, 1983

[30] Foreign Application Priority Data

Jan. 10, 1983 [JP] Japan .................................. 58-1132

[51] Int. Cl.⁴ .................... B32B 9/00; B32B 19/00; B32B 3/00; B32B 7/00
[52] U.S. Cl. .................................. 428/209; 428/446; 428/698; 428/901; 428/428; 174/68.5
[58] Field of Search .............. 428/698, 701, 699, 446, 428/702, 428, 210, 209; 501/65, 66, 61, 75; 174/68.5

[56] References Cited

U.S. PATENT DOCUMENTS

| | | | |
|---|---|---|---|
| 1,653,918 | 12/1927 | Martin | 428/698 X |
| 1,975,069 | 10/1934 | Benner et al. | 428/698 X |
| 3,173,779 | 3/1965 | Navias | 501/66 X |
| 3,565,684 | 2/1971 | Buck | 428/701 X |
| 3,637,425 | 1/1972 | McMillan et al. | 428/701 X |
| 3,682,840 | 8/1972 | Van Loan | 501/75 X |
| 3,753,057 | 8/1973 | Asher et al. | 501/66 X |
| 3,776,772 | 12/1973 | Asada et al. | 428/701 X |
| 3,950,174 | 4/1976 | Suzuki et al. | 501/75 X |
| 3,953,636 | 4/1976 | Kirchner | 428/701 X |
| 3,982,048 | 9/1976 | Zlupko | 501/61 X |
| 4,314,852 | 2/1982 | Brennan et al. | 501/65 X |
| 4,370,421 | 1/1983 | Matsushita et al. | 106/44 |
| 4,424,251 | 1/1984 | Sugishita et al. | 428/701 X |
| 4,436,829 | 3/1984 | Nowell | 501/75 X |

Primary Examiner—George F. Lesmes
Assistant Examiner—Nancy A. B. Swisher
Attorney, Agent, or Firm—Antonelli, Terry & Wands

[57] ABSTRACT

A thick film circuit board comprises at least parts of SiC substrate at which a thick film resistor is provided being coated with a glass layer having a good adhesion to the SiC substrate and the same or similar coefficient of thermal expansion as or to that of the SiC substrate, and no swelling, cracking and peeling appear on the thick film resistor and no electroconductive component is formed on laser-trimmed parts of the thick film resistor.

4 Claims, 2 Drawing Figures

THICK FILM CIRCUIT BOARD

BACKGROUND OF THE INVENTION

1. Field of the Invention

This invention relates to a thick film circuit board, and more particularly to a thick film circuit board with a thick film resistor formed on a silicon carbide substrate board.

2. Description of the Prior Art

Recently a thick film circuit board using a silicon carbide substrate has been proposed (U.S. Pat. No. 4,370,421). When a thick film resistor is directly formed on the substrate by a paste of high resistance (for example, a sheet resistivity of 1 k$\Omega$/□) having a glass content of 60% by weight, (a) the thick film resistor swells during firing due to the fact that a carbon dioxide gas generated by reaction with the SiC substrate according to the following reaction is not dissipated, because the paste has a high glass content and the resulting thick film resistor is not porous:

$$SiC + 4PbO \rightarrow SiO_2 + 4Pb + CO_2 \uparrow$$

(b) The thick film resistor has a considerably different coefficient of thermal expansion than that of the SiC substrate, and cracks develop in the thick film resistor.

(c) When the thick film resistor is trimmed by laser, an electroconductive component, which seems to be carbon, is formed at the laser-irradiated parts of the SiC substrate.

On the other hand, when a thick film resistor is directly formed on the substrate with a paste of low resistance (for example, a sheet resistivity of 100 $\Omega$/□) having a glass content of 45% by weight, (a) the thick film resistor becomes porous due to the low glass content, and thus the carbon dioxide gas formed by reaction with the SiC substrate during firing is dissipated without swelling of the thick film resistor, (b) the thus formed thick film resistor has the same or similar coefficient of thermal expansion as or to that of the SiC substrate, and no cracks develop, but (c) the electroconductive component is still formed when the thick film resistor is trimmed by laser.

SUMMARY OF THE INVENTION

The object of the present invention is to provide a thick film circuit board without swelling, cracking or peeling of a thick film resistor irrespective of resistance value, and also without any formation of electroconductive components at laser-trimmed parts on the thick film resistor.

The said object of the present invention can be attained according to such a structure that at least parts of the SiC substrate at which a thick film resistor is provided are coated with a glass layer having a good adhesion to the SiC substrate and the same or similar coefficient of thermal expansion as or to that of the SiC substrate.

Now, materials for use in the present invention will be described below.

A silicon carbide substrate for use in the present invention has a composition of 0.1–3.5% by weight of BeO in terms of Be, not more than 0.1% by weight of Al, not more than 0.1% by weight of B, and not more than 0.4% by weight of free carbon, the balance being SiC, and a thermal conductivity of at least 0.4 cal/cm·sec.°C. at 25° C., an electrical resistance of at least $10^7$ $\Omega$·cm at 25° C., and a coefficient of thermal expansion of $4.6 \times 10^{-6}$/°C. between 25° and 300° C.

A glass layer for use in the present invention has a good adhesion to a silicon carbide substrate, a thick film conductor, a thick film resistor, etc., and the same or similar coefficient of thermal expansion as or to that of silicon carbide substrate, and more specifically is a barium borosilicate glass comprising 10–25% by weight of BaO, 48–56% by weight of $SiO_2$, 18–33% by weight of $B_2O_3$, and 0–8% by weight of $Al_2O_3$ having a coefficient of thermal expansion of $32.5$–$42.4 \times 10^{-7}$/°C., where BaO serves to improve the adhesion to the SiC substrate.

A glass paste for use in the present invention is a mixture of 70–80% by weight of the said glass, and 20–30% by weight of an organic vehicle such as $\alpha$-terpineol containing 5–10% by weight of ethylcellulose on the basis of the terpineol. The mixture is printed, dried (150° C., 10 minutes), and fired (800°–950° C., 7–10 minutes) to form the glass layer.

A resistor paste for use in the present invention is based on a $RuO_2$ system, and specifically a mixture of 100 parts by weight of a uniform powdery mixture of 20–80% by weight of $RuO_2$ powder and 80–20% by weight of glass powder (15–30% by weight of PbO, 4–10% by weight of ZnO, 35–50% by weight of $SiO_2$, 15–30% by weight of $B_2O_3$, and 5–10% by weight of $Al_2O_3$) having a coefficient of thermal expansion of $32$–$42 \times 10^{-7}$/°C., and 25–30 parts by weight of an organic vehicle such as $\alpha$-terpineol containing 5–10% by weight of ethylcellulose. The paste is printed, dried (150° C., 10 minutes), and fired (800°–900° C., 7–10 minutes) to form the thick film resistor. The sheet resistance is 10 $\Omega$/□ (for 80% by weight of $RuO_2$) to 1 M$\Omega$/□ (for 20% by weight of $RuO_2$).

A conductor paste for use in the present invention is the ordinary one based on a Ag system, Ag-Pd system, Au system, Au-Pd system, etc., and the paste is printed, dried (150° C., 10 minutes), and fired (800°–900° C.) to form the thick film conductor.

DETAILED DESCRIPTION OF THE PREFERRED EMBODIMENTS

The present invention will be described in detail below, referring to Examples.

EXAMPLE 1

Figure 1:
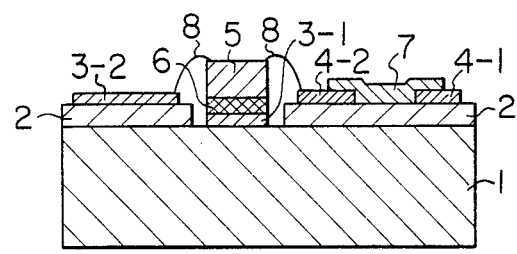
FIGS. 1 and 2 are cross-sectional views of thick film circuit boards according to the present invention.

7 kinds of glass pastes each consisting of a uniform mixture of 70% by weight of one of glass powders having compositions Nos. 1–7 shown in Table and 30% by weight of an organic vehicle ($\alpha$-terpineol containing 5% by weight of ethylcellulose on the basis of the terpineol) were printed on the one side of each SiC substrate 1 shown in FIG. 1, dried at 150° C. for 10 minutes, and fired at 800° C. for 7 minutes to form 7 kinds of glass layer 2 having a thickness of about 40 $\mu$m.

Then, an Ag-Pd paste (a uniform mixture of 100 parts by weight of a uniform powdery mixture of 72% by weight of Ag powder, 18% by weight of Pd powder, and 10% by weight of glass powder ($Bi_2O_3$ 72 wt %, PbO 13 wt %, ZnO 3 wt %, $SiO_2$ 8 wt %, $B_2O_3$ 2 wt %, $Al_2O_3$ 2 wt %) and 30 parts by weight of the same organic vehicle as above) was printed on each glass layer 2, dried at 150° C. for 10 minutes, and fired at 850° C. for 7 minutes to form thick film conductors 3-1 and 3-2 and thick film conductor terminals 4-1 and 4-2.

A resistor paste, which was a uniform mixture consisting of 100 g of uniform powder mixture of 20% by weight of $RuO_2$ powder and 80% by weight of glass powder (15% by weight of PbO, 4% by weight of ZnO, 35% by weight of $SiO_2$, 15% by weight of $B_2O_3$, and 5% by weight of $Al_2O_3$), and 25 g of an organic vehicle, which was α-terpineol containing 5% by weight of ethylcellulose, was printed between the thick film conductor terminals 4-1 and 4-2, dried at 150° C. for 10 minutes, and fired at 850° C. for 7 minutes to obtain a thick film resistor 7.

A power semi-conductor 5 was fixed to the thick film conductor 3-1 by a solder 6 consisting of 80% by weight of Pb and 20% by weight of Sn.

Then, the power semi-conductor 5, the thick film conductor 3-2, and the thick film conductor terminal 4-2 were wire-bonded by aluminum wires 8 to obtain a thick film circuit board.

The thick film resistor 7 formed on the glass layer 2 consisting of compositions Nos. 1-7 in Table had no swelling and peeling when formed, and the thick film resistor 7 formed on the glass layer 2 consisting of compositions Nos. 2-6 in Table had no cracking.

When the thick film resistor 7 was trimmed by laser, no electroconductive component was formed when the glass layer 2 consisted of compositions Nos. 1-7 in Table and thus the resistors could be adjusted.

It was found from the results as shown in Table that the most suitable glass compositions for the present glass layer are those of Nos. 2-6 in Table.

90% by weight of Ag powder and 10% by weight of the same glass powder as used in Example 1, and 30 parts by weight of the same organic vehicle as above) was printed on each glass layer 2, dried at 150° C. for 10 minutes, and fired at 850° C. for 15 minutes to obtain thick film conductors 3-1 and 3-2 and thick film conductor terminals 4-1 and 4-2.

A resistor paste, which was a uniform mixture consisting of 100 g of a uniform powdery mixture of 80% by weight of $RuO_2$ powder and 20% by weight of glass powder (30% by weight of PbO, 10% by weight of ZnO, 50% by weight of $SiO_2$, 30% by weight of $B_2O_3$ and 10% by weight of $Al_2O_3$), and 28 g of an organic vehicle (α-terpineol containing 10% by weight of ethylcellulose on the basis of the terpineol), was printed between the thick film conductor terminals 4-1 and 4-2, dried at 150° C. for 10 minutes, and fired at 850° C. for 15 minutes to obtain a thick film resistor 7.

A power semi-conductor 5 was formed on the thick film conductor 3-1 in the same manner as in Example 1.

Then, the power semi-conductor 5, the thick film conductor 3-2 and the thick film conductor terminal 4-2 were wire-bonded in the same manner as in Example 1 to obtain a thick film circuit board.

The same effects upon swelling, peeling and cracking of thick film resistor 7 as in Nos. 1-7 in the said Table were obtained, and also the same effect upon the laser-trimming of thick film resistor 7 as in Nos. 1-7 in the said Table was obtained.

EXAMPLE 3

A glass paste was prepared from a glass powder having composition No. 8 in the said Table in the same

TABLE

| | | Sample No. | | | | | | | |
|---|---|---|---|---|---|---|---|---|---|
| | | 1 | 2 | 3 | 4 | 5 | 6 | 7 | 8 |
| Composition (% by weight) | BaO | 9.43 | 13.82 | 10.64 | 19.28 | 25.01 | 24.52 | 24.10 | — |
| | $SiO_2$ | 53.51 | 56.18 | 48.62 | 55.80 | 54.98 | 49.60 | 48.03 | 32.50 |
| | $B_2O_3$ | 32.04 | 30.00 | 32.79 | 24.26 | 20.01 | 19.54 | 18.05 | 5.00 |
| | $Al_2O_3$ | 5.02 | — | 7.95 | 0.72 | — | 6.34 | 9.83 | 4.00 |
| | PbO | — | — | — | — | — | — | — | 50.00 |
| Coefficient of thermal expansion ($\times 10^{-7}$/°C.) | | 30.5 | 32.5 | 33.9 | 36.4 | 40.6 | 42.4 | 43.6 | 65.0 |
| Swelling occurence in thick film resistor | | No | No | No | No | No | No | No | — |
| Peeling occurence in thick film resistor | | No | No | No | No | No | No | No | — |
| Crack occurrence in thick film resistor | | Yes | No | No | No | No | No | Yes | — |
| Formation of electroconductive component at laser trimming of thick film resistor | | No | No | No | No | No | No | No | — |

EXAMPLE 2

Figure 2:
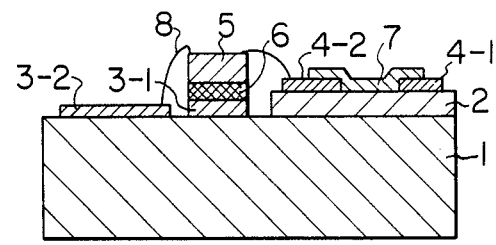

7 kinds of glass pastes each consisting of a uniform mixture of 80% by weight of one of glass powders having compositions Nos. 1-7 shown in Table and 20% by weight of an organic vehicle (α-terpineol containing 10% by weight of ethylcellulose on the basis of the terpineol) was printed on the one side of each SiC substrate 1, as shown in FIG. 2, dried at 150° C. for 10 minutes, and fired at 850° C. for 10 minutes to obtain 7 kinds of glass layer 2 having a thickness of about 50 μm.

Then, an Ag paste (a uniform mixture consisting of 100 parts by weight of a uniform powdery mixture of manner as in Example 1, and printed on a SiC substrate, dried at 150° C. for 10 minutes, and fired at 850° C. for 7 minutes. Swelling, peeling and cracking were developed in the resulting glass layer, which could not be practically used.

What is claimed is:

1. A thick film circuit board which comprises a substrate containing SiC, a thick film resistor provided over at least parts of the SiC-containing substrate, said at least parts of the SiC-containing substrate at which the thick film resistor is provided being coated with a glass layer having a good adhesion to the SiC-containing substrate and the same or similar coefficient of thermal expansion as or to that of the SiC-containing substrate; said glass layer being a barium borosilicate consisting of 10–25% by weight of BaO, 48–56% by weight of $SiO_2$, 18–33% by weight of $B_2O_3$, and 0–8% by weight of $Al_2O_3$; said SiC-containing substrate consisting essentially of 0.1–3.5% by weight of BeO in terms of Be, not more than 0.1% by weight of Al, not more than 0.1% by weight of B, not more than 0.4% by weight of free carbon, the balance being SiC; and said thick film resistor consisting of 20–80% by weight of $RuO_2$ and 80–20% by weight of glass having 15–30% by weight of PbO, 4–10% by weight of ZnO, 35–50% by weight of $SiO_2$, 15–30% by weight of $B_2O_3$, and 5–10% by weight of $Al_2O_3$.

2. A thick film circuit board according to claim 1, wherein the SiC substrate has a coefficient of thermal expansion of not more than $4.6 \times 10^{-6}/°C$. at 25°–300° C., an electrical resistance of at least $10^7 \Omega \cdot cm$ at 25° C., and a thermal conductivity of at least 0.4 cal/cm·sec·°C. at 25° C.

3. A thick film circuit board according to claim 3, wherein said glass layer has a coefficient of thermal expansion of $32.5-42.4 \times 10^{-7}/°C$. and said thick film resistor exhibits a coefficient of thermal expansion of $32-42 \times 10^{-7}/°C$.

4. A thick film circuit board according to claim 1, further comprising a thick film conductor that is arranged on selected portions of the SiC-containing substrate and on selected portions of the glass layer, with portions of said thick film conductor forming conductor terminals on said glass layer, said thick film resistor being arranged between said terminals, and metal wires connecting the thick film conductor to a power semiconductor affixed to a portion of the thick film conductor arranged on said SiC-containing substrate.

* * * * *